(12) United States Patent
Lacy

(10) Patent No.: US 6,313,750 B1
(45) Date of Patent: Nov. 6, 2001

(54) MEASURING CELL VOLTAGES OF A FUEL CELL STACK

(75) Inventor: Robert A. Lacy, Scotia, NY (US)

(73) Assignee: Plug Power Inc., Latham, NY (US)

( * ) Notice: Subject to any disclaimer, the term of this patent is extended or adjusted under 35 U.S.C. 154(b) by 0 days.

(21) Appl. No.: 09/379,088

(22) Filed: Aug. 23, 1999

(51) Int. Cl.$^7$ .................................................. G08B 21/00
(52) U.S. Cl. ......................... 340/636; 340/635; 340/660; 324/433; 324/434
(58) Field of Search .................................. 340/636, 635, 340/660, 661; 324/433, 434

(56) References Cited

U.S. PATENT DOCUMENTS

| 5,170,124 | 12/1992 | Blair et al. . |
|---|---|---|
| 5,763,113 | 6/1998 | Meltser et al. . |
| 5,914,606 | 6/1999 | Becker-Irvin . |
| 6,118,384 | * 9/2000 | Sheldon et al. ....................... 340/636 |
| 6,140,820 | * 10/2000 | James .................................. 324/434 |
| 6,147,499 | * 11/2000 | Torji et al. ........................... 324/434 |

FOREIGN PATENT DOCUMENTS 0 575 205 A1    6/1993   (EP) .

* cited by examiner

Primary Examiner—Julie Lieu
(74) Attorney, Agent, or Firm—Trop, Pruner & Hu, P.C.

(57) ABSTRACT

A system includes a divider network, a memory and a circuit. The divider network is adapted to be coupled to fuel cells of a fuel cell stack and provide pairs of signals. Each pair of signals is associated with a different fuel cell and indicates a terminal voltage of the associated cell and another voltage common to the pair of signals. The memory stores indications of different common mode gains, and each common mode gain indication is associated with a different one of the pairs of signals. The circuit is coupled to the memory and adapted to generate an indication of the terminal voltage from each pair based on the associated common mode gain indication.

20 Claims, 6 Drawing Sheets

MEASURING CELL VOLTAGES OF A FUEL CELL STACK

BACKGROUND

The invention relates to measuring cell voltages of a fuel cell stack.

A fuel cell is an electrochemical device that converts chemical energy produced by a reaction directly into electrical energy. For example, one type of fuel cell includes a proton exchange membrane (PEM), a membrane that may permit only protons to pass between an anode and a cathode of the fuel cell. At the anode, diatomic hydrogen (a fuel) is oxidized to produce hydrogen protons that pass through the PEM. The electrons produced by this oxidation travel through circuitry that is external to the fuel cell to form an electrical current. At the cathode, oxygen is reduced and reacts with the hydrogen protons to form water. The anodic and cathodic reactions are described by the following equations:

$H_2 \rightarrow 2H^+ + 2e^-$ at the anode of the cell, and $O_2 + 4H^+ + 4e^- \rightarrow 2H_2O$ at the cathode of the cell.

Because a single fuel cell typically produces a relatively small voltage (around 1 volt, for example), several fuel cells may be formed out of an arrangement called a fuel cell stack to produce a higher voltage. The fuel cell stack may include plates (graphite composite or metal plates, as examples) that are stacked one on top of the other, and each plate may be associated with more than one fuel cell of the stack. The plates may be made from a graphite composite material and include various channels and orifices to, as examples, route the reactants and products through the fuel cell stack. Several PEMs (each one being associated with a particular fuel cell) may be dispersed throughout the stack between the anodes and cathodes of the different fuel cells.

The health of a fuel cell stack may be determined by monitoring the individual different terminal voltages (herein called cell voltages) of the fuel cells. In this manner, a particular cell voltage may vary under load conditions and cell health over a range from −1 volt to +1 volt. The fuel cell stack typically may include a large number of fuel cells, and thus, common mode voltages (voltages with respect to a common voltage (ground)) of the terminals of the fuel cells 16 may be quite large (i.e., some of the voltages of the terminals may be near 100 volts, for example). Unfortunately, semiconductor devices that may be used to measure the cell voltages typically are incapable of receiving high common mode voltages (voltages over approximately 18 volts, for example).

For example, referring to FIG. 1, in a fuel cell system 10, a fuel cell voltage monitoring circuit 14 may be used to measure the differential voltages across fuel cells 16 (fuel cells $16_1$, $16_2$ ... $16_N$, as examples) of a fuel cell stack 12. The stack 12 forms an overall stack voltage called $V_{CELL}$. Because the fuel cells 16 are serially coupled together, the common mode voltage of a particular cell 16 becomes progressively greater the farther the cell 16 is away from the ground connection. For example, the cell voltages of the terminals 18 and 19 may have relatively low common mode voltages, as the voltages of the terminals 18 and 19 are formed from one fuel cell $16_1$ and two fuel cells $16_1$ and $16_2$, respectively. However, farther from the ground connection, a cell terminal 20 has a much higher common mode voltage.

Because the voltage monitoring circuit 14 may include a semiconductor device that cannot receive large common mode voltages (a voltage above approximately 18 volts, for example) at its input terminals, the voltage monitoring circuit 14 may include circuitry to scale down the voltage(s) that are furnished by the cell terminals. In this manner, the voltage monitoring circuit 14 may use the circuitry to indicate a scaled down version of a particular cell voltage and then derive an indication of the actual cell voltage by upscaling the scaled down value by the appropriate amount. For example, the circuitry may scale down the voltages by a factor of 10. Therefore, for this example, the circuitry may receive a voltage of 100 volts and provide a corresponding voltage of 10 volts to a semiconductor that is used to measure the cell voltage, for example.

As a more specific example, resistive dividers (not shown in FIG. 1) may be coupled inline with measurement terminals 15 (of the voltage monitoring circuit 14) that extend to different cell terminals of the fuel cell stack 12. If all of the resistive dividers reduce the common mode voltages by the same amount, then the system 10 works as desired. However, unfortunately, the resistive dividers may have tolerances due to the tolerances of their resistive components. These tolerances, in turn, may cause common mode voltages to be introduced into the measurements of the cell voltages.

For example, the voltage monitoring circuit 14 may attempt to measure a voltage $V_N$ (i.e., the cell voltage of the fuel cell $16_N$) by conducting a voltage measurement across cell terminals 20 and 21. However, because of the non-ideal circuitry, such as resistive dividers, that are used to scale down the measured voltage, the monitoring circuit 14 may effectively measure the following voltage (called $V_{MEAS}$):

$$V_{MEAS} = K_1 \cdot V_N + K_2 \cdot V_{CM}, \quad \text{(Equation 1)}$$

where $K_1$ is a differential gain (ideally the scaling factor that is supposed to be introduced by the resistive divider), $K_2$ is a common mode gain (ideally zero) and $V_{CM}$ is the voltage common to the cell terminals 20 and 21. Thus, as can be seen from Equation 1, the $V_{MEAS}$ measured voltage may not be proportional to the cell voltage $V_N$, but instead, the $V_{MEAS}$ measured voltage may include a common mode component, $K_2 \cdot V_{CM}$. This common mode component, in turn, introduces an error into the measurement and thus, may inhibit the ability of the voltage monitoring circuit 14 to accurately monitor the health and load of the cells 16. This inaccuracy, in turn, may impede the ability of the voltage monitoring circuit 14 to recognize when a particular fuel cell has failed or is about to fail and thus, may impede the ability of the voltage monitoring circuit 14 to take the appropriate corrective action (an action that includes shutting down the stack 10 or alerting an operator, as examples).

SUMMARY

In one embodiment of the invention, a system includes a divider network, a memory and a circuit. The divider network is adapted to be coupled to fuel cells of a fuel cell stack and provide pairs of signals. Each pair of signals is associated with a different fuel cell and indicates a terminal voltage of the associated cell and another voltage common to the pair of signals. The memory stores indications of different common mode gains, and each common mode gain indication is associated with a different one of the pairs of signals. The circuit is coupled to the memory and is adapted to generate an indication of the terminal voltage from each pair based on the associated common mode gain indication.

Advantages and other features of the invention will become apparent from the following description, from the drawing and from the claims.

DETAILED DESCRIPTION

Figure 1:
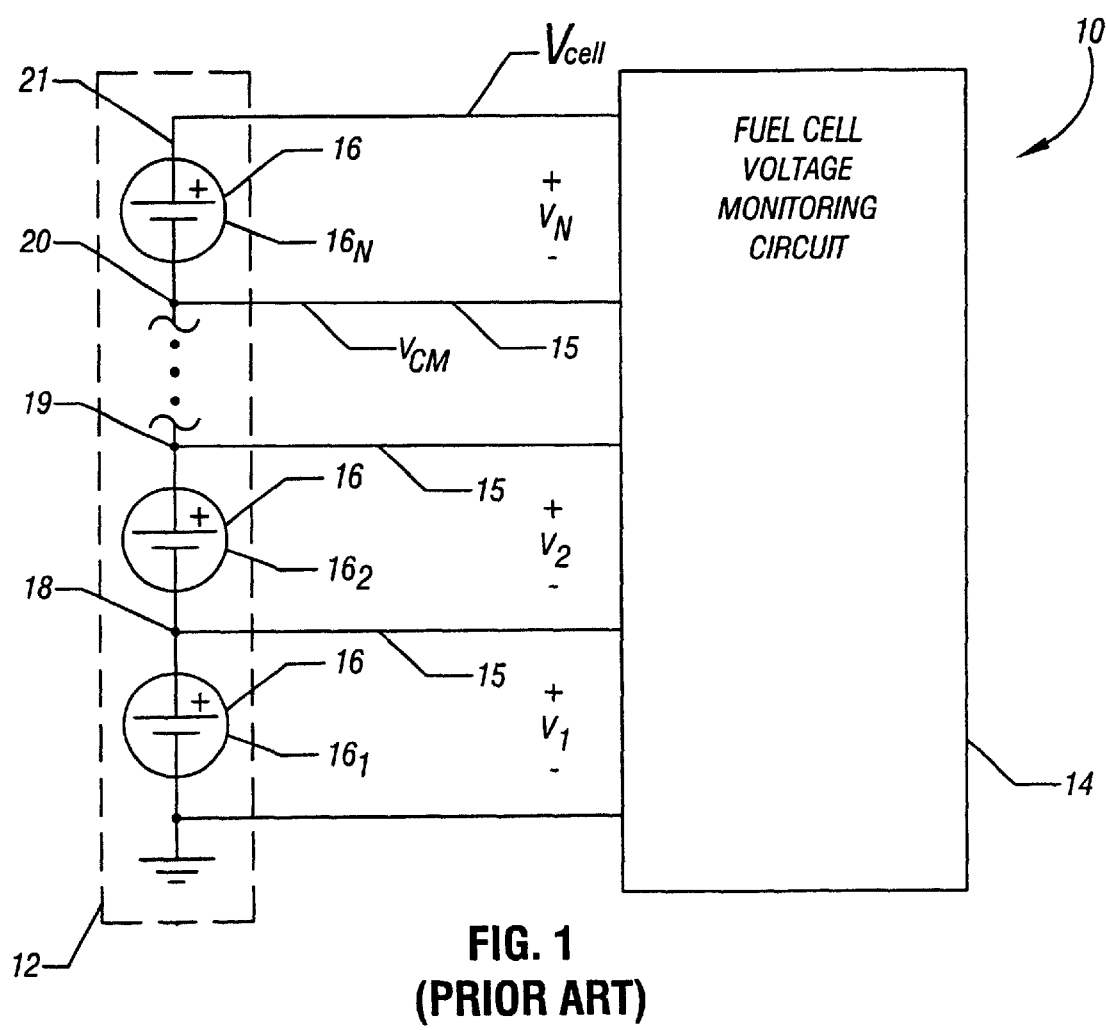
FIG. 1 is a schematic diagram of a fuel cell voltage monitoring system of the prior art.
Figure 2:
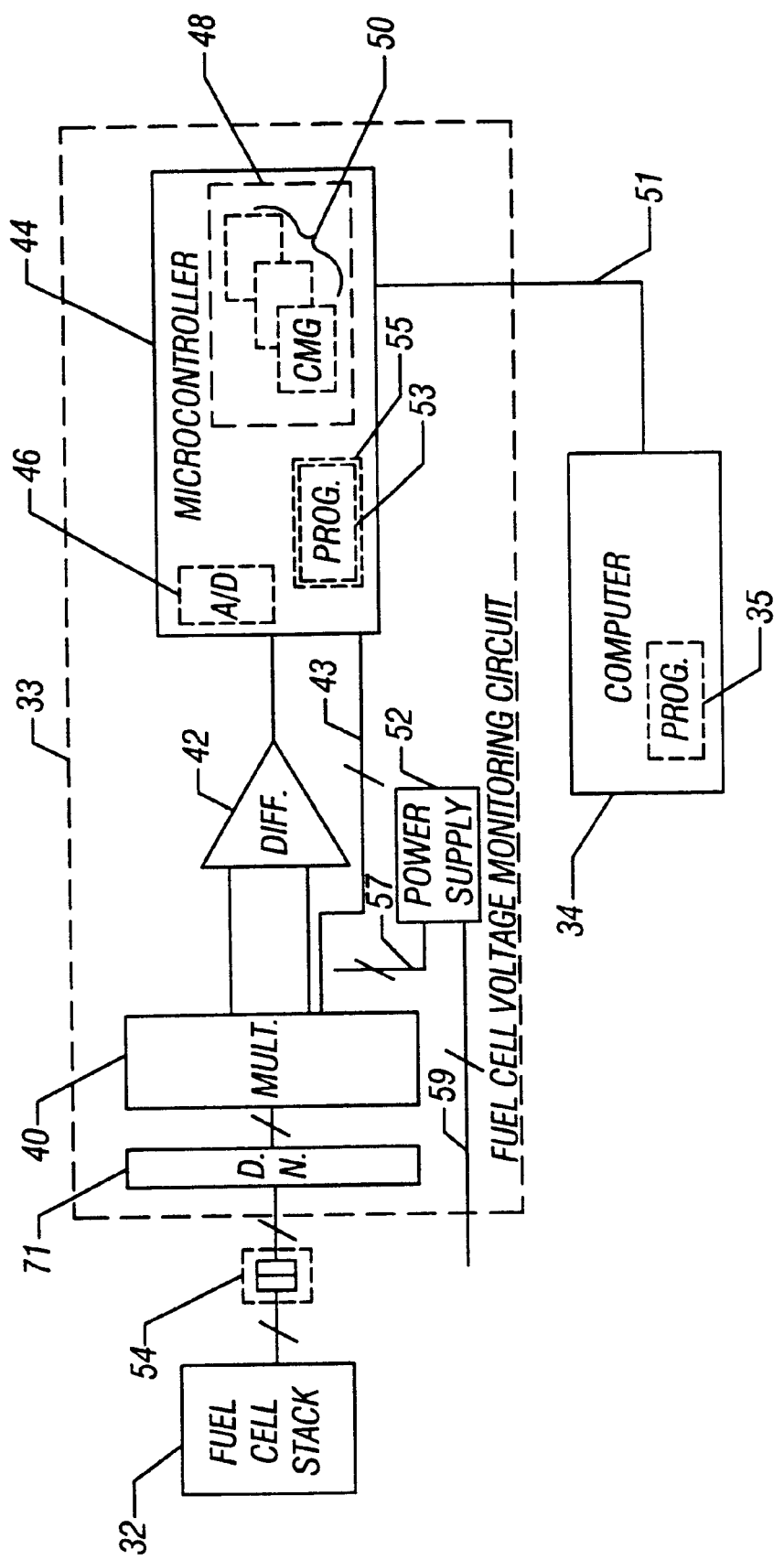
FIG. 2 is a schematic diagram of a fuel cell voltage monitoring system according to an embodiment of the invention.

Referring to FIG. 2, an embodiment 33 of a fuel cell voltage monitoring circuit in accordance with the invention includes a divider network 71 that is coupled to a fuel cell stack 32 for purposes of scaling down common mode voltages that are present on terminals of the fuel cell stack 32. The voltage monitoring circuit 33, in turn, uses these scaled down voltages to monitor cell voltages of the fuel cell stack 32. The divider network 71 may not be ideal, but rather, the divider network 71 may introduce common mode voltage errors into the scaled down voltages. However, the voltage monitoring circuit 33 compensates for these errors, as described below.

More particularly, to perform a measurement of a particular cell voltage, the voltage monitoring circuit 33 includes a multiplexer 40 to select (via the divider network 71) a pair of cell terminals of the fuel cell stack 32, and ideally, the multiplexer 40 should furnish a pair of signals that differentially indicate a voltage that is proportional to the cell voltage. However, due to tolerances of components of the divider network 71, the divider network 71 may introduce an error so that the pair of signals do not differentially indicate the cell voltage. In his manner, a differential amplifier 42 receives the pair of signals that are provided by the multiplexer 40 and produces an output signal that indicates the measured cell voltage. Because the divider network 71 may introduce a nonzero common mode voltage gain into the pair of signals, the output voltage of the differential amplifier 42 may include a common mode voltage component, i.e., the error voltage. To compensate the output voltage to remove the error voltage, the voltage monitoring circuit 33 stores indications 50 of common mode gains that are obtained in a separate calibration routine, described below. In this manner, each common mode gain is associated with one of the cell voltage measurements, and by using the common mode gain that is associated with a particular cell voltage measurement for compensation purposes, the voltage monitoring circuit 33 may correct the indicated measured voltage (that is provided by the output voltage of the differential amplifier 42) to obtain a more accurate indication of the cell voltage.

Figure 3:
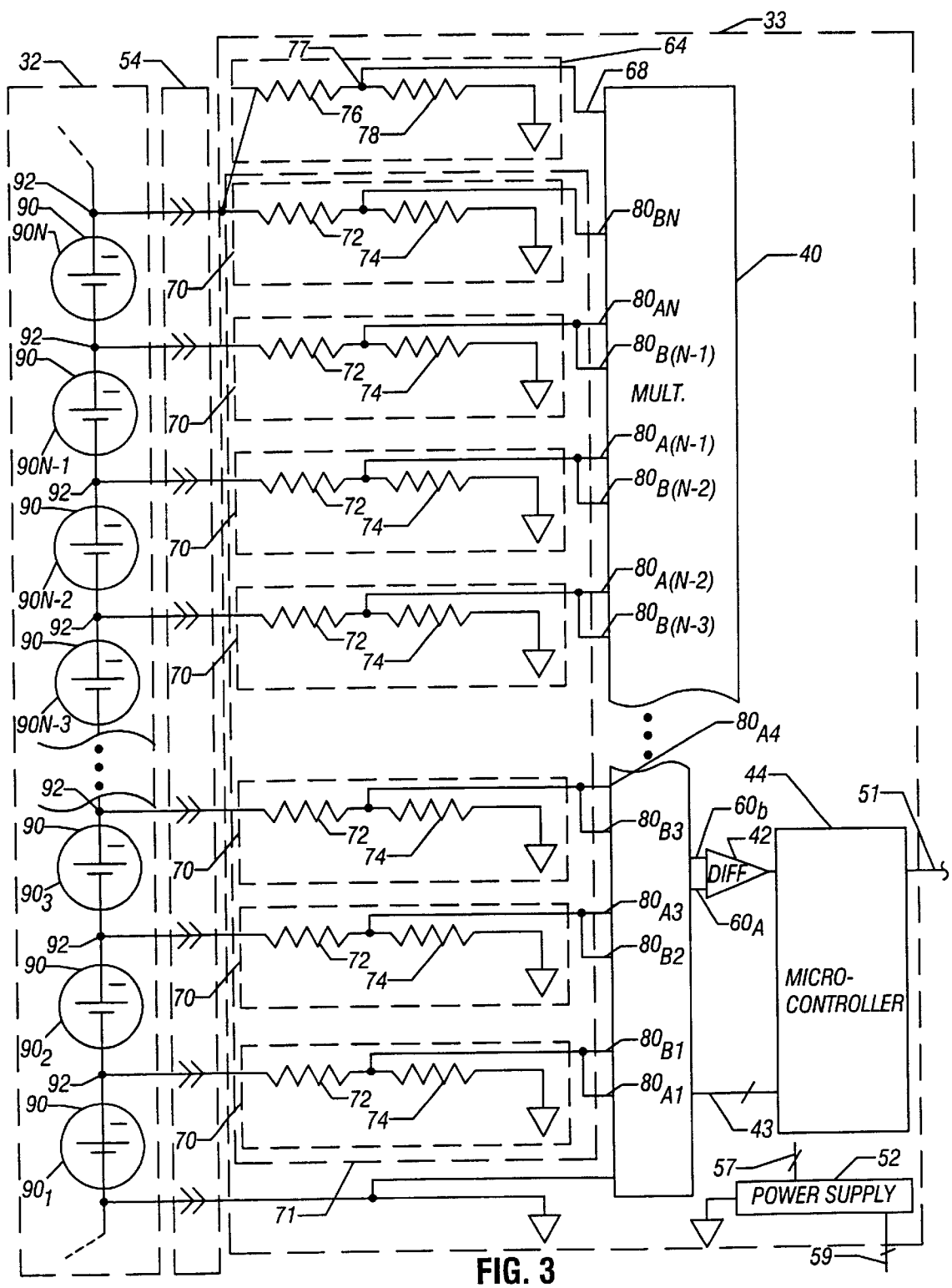
FIG. 3 is a more detailed schematic diagram of a portion of the fuel cell voltage monitoring system of FIG. 2 according to an embodiment of the invention.

Referring to FIG. 3, more particularly, the multiplexer 40 may include input terminals 80 that are used to perform the different measurements of the cell voltages, and in some embodiments, the multiplexer 40 measures one cell voltage at a time as directed by selection lines 43. In this manner, based on the pair of terminals 80 that is indicated by the selection lines 43, the multiplexer 40 couples routes the selected input terminals 80 to two input terminals $60_A$ and $60_B$ of the differential amplifier 42.

For convenience, the following notation is used when referring to the input terminals 80 of the multiplexer 40. The subscript "A" indicates an input terminal 80 (when selected) that is coupled to the input terminal $60_A$. The subscript "B" represents an input terminal 80 (when selected) that is coupled to the input terminal $60_B$. The numerical subscript (1, 2, . . . N) refers to the particular cell that is being measured with the particular input terminal 80. For example, as depicted in FIG. 3, the fuel cell stack 32 may be formed from N fuel cells 90 (cells $90_1$, $90_2$, $90_3$ . . . $90_N$, as examples). Thus, in this manner, the subscript "1" denotes an input terminal 80 that is used to measure the voltage of the cell $90_1$, and similarly the subscript "4" indicates the input terminal 80 that is used to measure the voltage of the cell $90_4$. Therefore, as an example, to measure the voltage of the cell $90_{N-2}$, the selection lines 43 cause the multiplexer 40 to select the input terminals $80_{B(N-2)}$ and $80_{A(N-2)}$ and couple these input terminals to the input terminals $60_A$ and $60_B$, respectively, of the differential amplifier 42.

Figure 4:
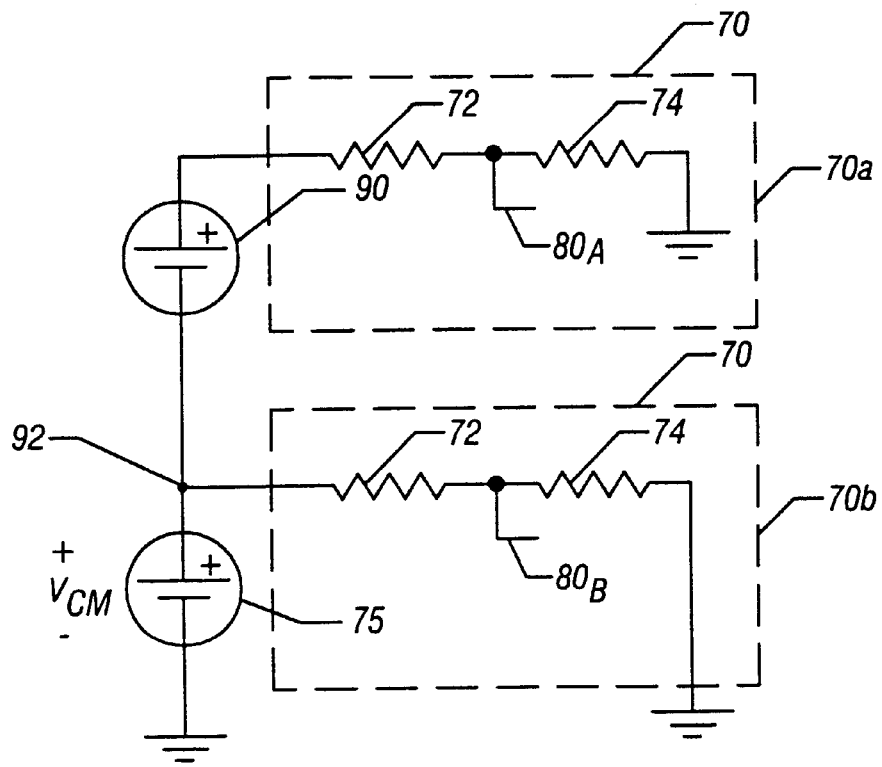
FIG. 4 is a schematic diagram illustrating the effect of a common mode voltage on a cell voltage measurement that is performed by the fuel cell voltage monitoring circuit of FIG. 2.

As an example, in some embodiments, the divider network 71 may be formed (at least in part) by resistive dividers 70 that are depicted in FIG. 3. Each resistive divider 70 is coupled between an input terminal 80 and a terminal 92 of one of the cells 90. FIG. 4 depicts a schematic diagram that illustrates a common mode voltage component that may be introduced by exemplary resistive dividers 70a and 70b (that have the same general design of the resistive divider 70). As shown, each resistive divider 70a, 70b may include two serially coupled resistors 72 and 74. One terminal of the resistor 72 may be coupled to one of the cell terminals 92, for example, and another terminal of the resistor 72 is coupled to a terminal of the resistor 74. The other terminal of the resistor 74 is coupled to ground. If each resistive divider 70a, 70b maintains an exact scaling ratio, then a common mode voltage (called $V_{CM}$) that appears at the input terminals $80_A$ and $80_B$ (at the respective unions of the resistors 72 and 74 of the resistive dividers 70a and 70b) may be effectively cancelled when the differential amplifier 42 subtracts the voltage of the input terminal 80A from the voltage of the input terminal $80_B$. However, unfortunately, due to tolerances in the resistors 72 and 74, the voltage between the input terminals 80A and $80_B$ has a common mode voltage component, as described by the following equation:

$$V_A - V_B = K_1 \cdot V_T + K_2 \cdot V_{CM}, \quad \text{(Equation 2)}$$

where "$V_A$" is the voltage of the terminal $80_A$, "V" is the voltage of the terminal $80_B$, "$K_1$" is a differential gain, "$K_2$" is a common mode gain, "$V_T$" is a terminal voltage of the cell 90 and "$V_{CM}$" is a voltage that is common to the terminals $80_A$ and $80_B$. As a more specific example, the resistors 72 and 74 may have a 1% tolerance specification value, and the resistive divider 70 may ideally form a 1:10 scaling ratio. For example, the resistor 72 may ideally have a resistance 9R, and the resistor 74 may ideally have a resistance R to produce the scaling ratio of 0.1. For the worst case scenario (in reference to common mode gain), the resistance of the resistor 72 (of the resistive divider 70a) has a resistance of 8.91R (instead of 9 R), the resistance of the resistor 74 (of the resistive divider 70a) has a resistance of 1.01R (instead of R), the resistor 72 (of the resistive divider 70b) has a resistance of 9.9R (instead of 9 R) and the resistor 74 (of the resistive divider 70b) has a resistance of 0.99R (instead of R). For this specific example, the common mode gain $K_2$ is 0.003 volts, and the differential gain $K_1$ is 0.010 volts. Thus, for this example, a common mode voltage of approximately 100 volts produces an error voltage of about 0.3 volts, a significant error voltage when the cell voltage being measured may be approximately 1 volt.

For purposes of removing the error voltages that may be introduced by the tolerances of the divider network (such as the resistive dividers 70, for example), in some embodiments, the voltage monitoring circuit 33 stores the indications 50 of the common mode gains for all of the associated measurements to be performed, i.e., the monitoring circuit 33 stores an indication 50 of a common mode voltage gain for each cell 90 in, for example, a memory 48. For example, the measurement of the terminal voltage of cell $90_3$ may have an associated nonzero common mode voltage gain that is introduced by the divider network 71, and the measurement of the voltage of the cell $90_N$ may also have an associated common mode voltage gain. The memory 48 may be, for example, a non-volatile memory, such as an electrically erasable programmable read only memory (EEPROM) or a flash memory, as just a few examples.

In some embodiments, when the voltage monitoring circuit 33 measures a particular cell voltage, a microcontroller 44 may perform the needed adjustment to remove the error voltage. To accomplish this, in some embodiments, the microcontroller 44 estimates the common mode voltage that is associated with the measurement, as described below. The microcontroller 44 subsequently determines the product of the common mode voltage gain and the common mode voltage and subtracts this result from the voltage that is indicated by the differential amplifier 42. The microcontroller 44 may then determine the actual cell voltage by upscaling the end product by the differential gain (i.e., the ideal scaling ratio) that is introduced by the divider network 71.

To obtain the common mode voltage for a particular correction, the microcontroller 44 may utilize a resistive divider 64 (coupled between an input terminal 68 of the multiplexer 40 and the top terminal 92 of the fuel cell stack 32, for example) to measure the highest common mode potential (for example) of the fuel stack 32. The microcontroller 44 may then use the voltage of the fuel cell stack 32 to estimate (based on a linear assumption, for example) the common mode voltage for a particular measurement. For example, for a fuel cell stack of 100 cells, the microcontroller 44 may, via the resistive divider 64, determine that the terminal voltage of the entire fuel cell stack is approximately 100 volts. Thus, for this example, when measuring the voltage of the cell $90_3$ (i.e., the third cell from the ground level), the microprocessor 44 may estimate that the common mode voltage of this measurement is approximately 3/100, or 0.03 volts.

Figure 5:
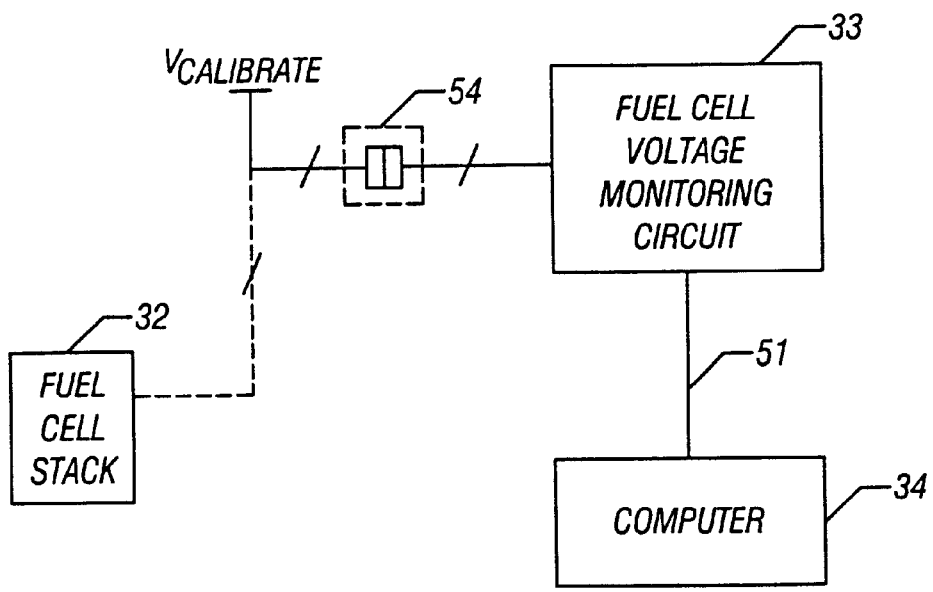
FIG. 5 is a block diagram illustrating a technique to calibrate the fuel cell voltage monitoring circuit of FIG. 2 according to an embodiment of the invention.

The common mode gains for the different measurements may be obtained by the arrangement depicted in FIG. 5. In particular, the terminals 80 of the voltage monitoring circuit 33 may be initially coupled (via a connector 54) to a calibration voltage called $V_{CALIBRATE}$. Because each resistive divider 70 is coupled to the same predetermined voltage level, no differential voltage source is present in the measurement of a particular cell voltage. Therefore, by performing the measurements with the $V_{CALIBRATE}$ voltage, the monitoring circuit 33 may directly measure the different associated common mode error voltages. In some embodiments, the voltage monitoring circuit 33, during a calibration mode, communicates (via a serial link 51, for example) these measurements to a computer 34 (a microprocessor-based personal computer, for example). The computer 34 may then obtain the common mode gains by dividing the measured error voltages by the $V_{CALIBRATE}$ voltage. Afterwards, the computer 34 may communicate (via the serial link 51) indications of the common mode gains to the circuit 33 to store the indications 50 in the memory 48. After calibration, the microcontroller 44 may use the indications 50 to correct the measured cell voltages when the circuit 33 is connected to the fuel cell stack 32, as described above.

Figure 6:
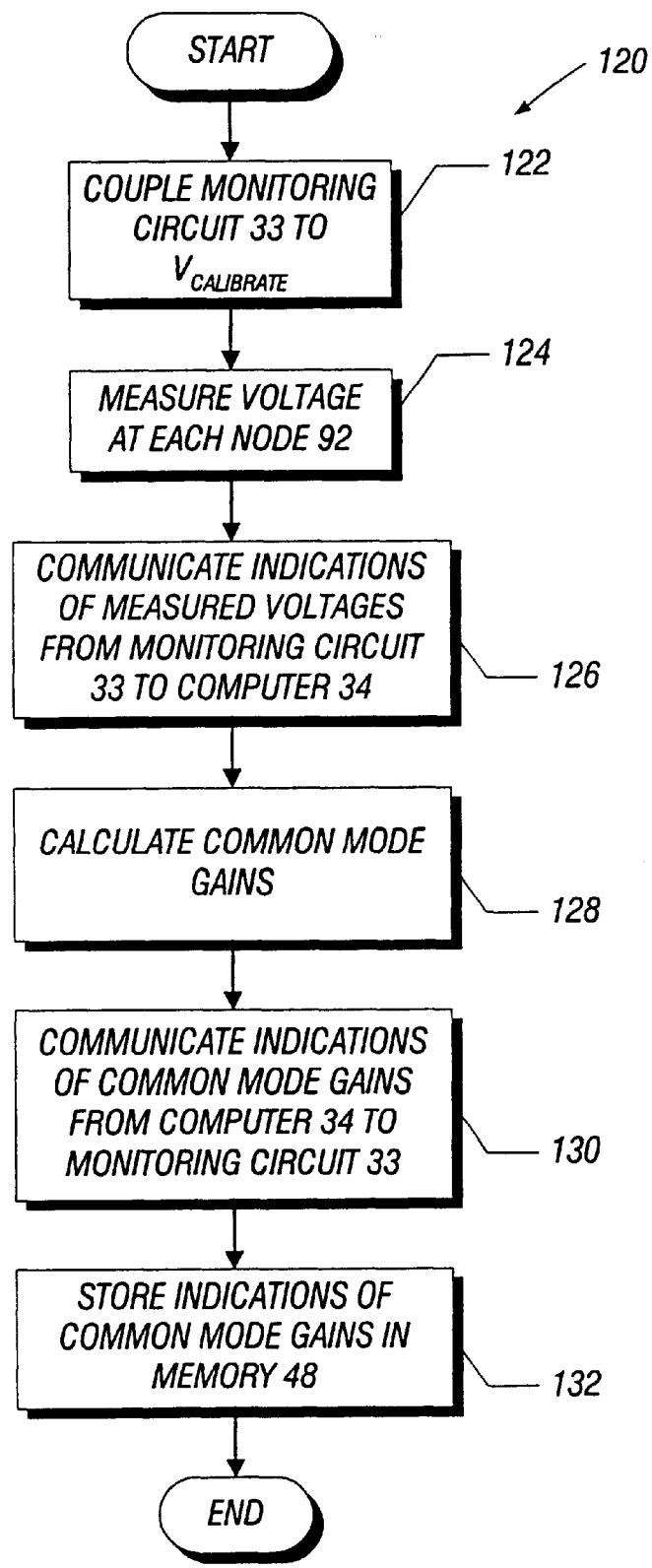
FIG. 6 is a flow diagram illustrating a routine to calibrate the fuel cell voltage monitoring circuit of FIG. 2 according to an embodiment of the invention.

To summarize, a routine 120 (that is depicted in FIG. 6) may be used to derive the common mode voltage gains. In particular, the voltage monitoring circuit 33 is first coupled (block 122) to the $V_{CALIBRATE}$ voltage. Next, the measurements are performed (block 124) to obtain the error voltages. Thus, in this manner, the multiplexer 40, as an example, selects the terminals $80_{B1}$ and $80_{A1}$, then selects the terminals $80_{B2}$ and $80_{A2}$, etc. After the voltage monitoring 33 measures the error voltages, the circuit 33 communicates (block 126) indications of the measured error voltages to the computer 34. Next, the computer 34 calculates (block 128) the common mode gains and subsequently, communicates (block 130) indications of the common mode gains to the voltage monitoring circuit 33. The voltage monitoring circuit 33 subsequently stores (block 132) indications of the common mode gains in the memory 48.

A routine 140 (depicted in FIG. 7) summarizes the cell measurements and corrections that are performed by the voltage monitoring circuit 33. In particular, before the monitoring of the cell voltages begins, the microcontroller 44 selects (via the selection lines 43) the input terminals from the resistive dividers 64 to measure (block 142) the entire voltage of the fuel cell stack 32 for purposes of estimating the common mode voltages. Next, the microcontroller 44 begins a loop to perform the measurements of the cell voltages. In this manner, the microcontroller 44 selects the input terminals $80_A$ and $80_B$ that are associated with a particular cell 90 to measure (block 144) the next cell voltage. After the microcontroller 44 receives the measured voltage, the microcontroller 44 uses (block 146) the associated common mode voltage gain (that is stored in the memory of 48) to remove the error voltage (if any). If the microcontroller 44 determines (dimond 148) that all of the cell voltages have not been measured, then the microcontroller 44 returns to block 144. Otherwise, the microcontroller 44 may then either terminate the monitoring of the fuel cell stack 32 for a predetermined period or alternatively, return to block 144 to continuously monitor the cell voltages of the fuel cell stack 32.

Figure 7:
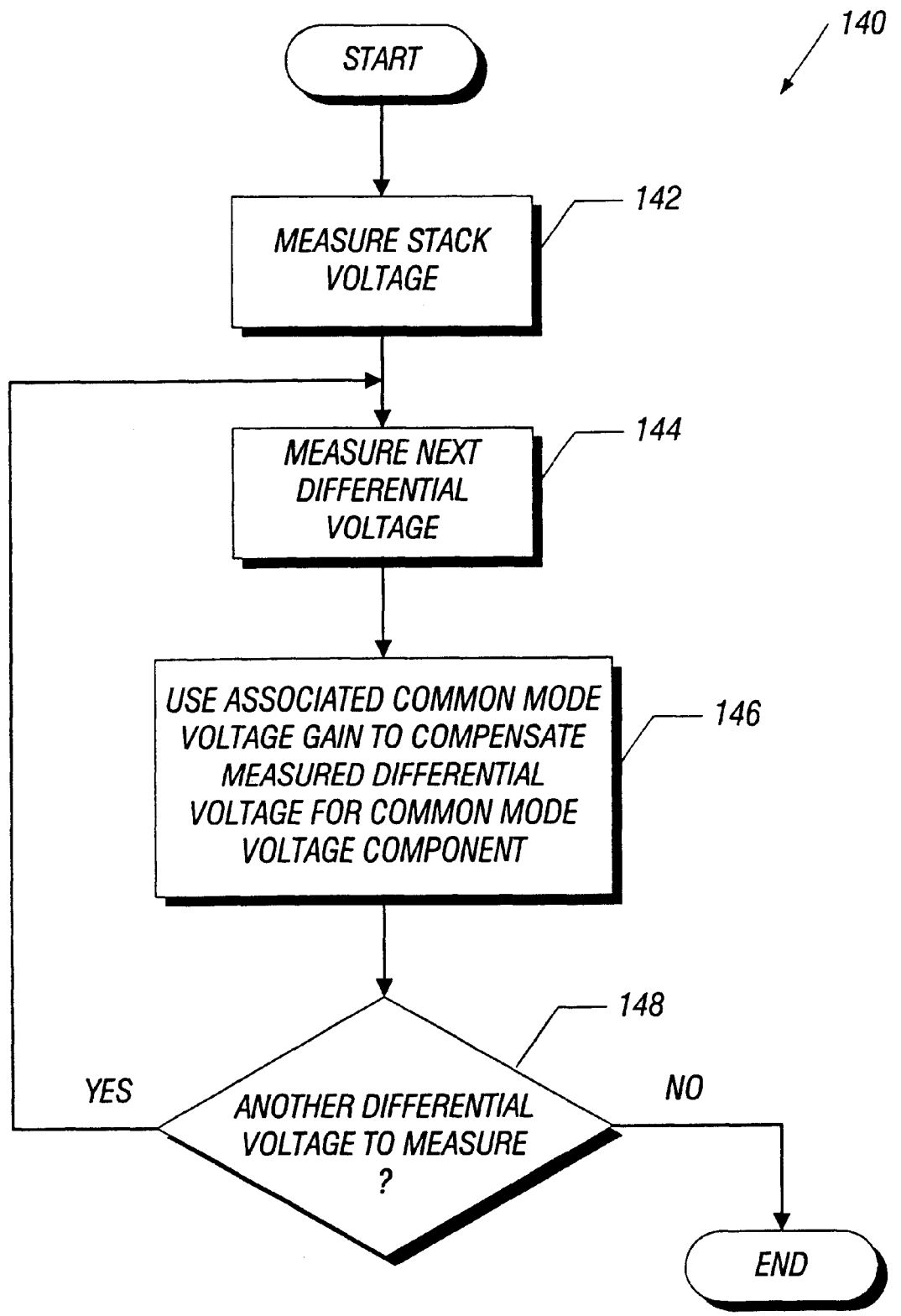
FIG. 7 is a flow diagram illustrating a routine to adjust cell voltage measurements to compensate for the effects of common mode voltages according to an embodiment of the invention.

Referring to FIG. 2, among the other features of the voltage monitoring circuit 33, the microcontroller 44 may include a program 53 that is stored in a non-volatile memory of a microcontroller 44, such as an EEPROM or a flash memory, as just a few examples. In this manner, the program 53, when executed by the microcontroller 44, may cause the microcontroller 44 to perform the functions described above, including the routine 140 that is depicted in FIG. 7. The microcontroller 44 may also include an analog-to-digital (A/D) converter 46 (a twelve bit A/D converter, as an example) to convert the analog output signal from the differential amplifier 42 into a digital format for processing by the microcontroller 44. In some embodiments, the memory 48 may be an internal memory of the microcontroller 44 (as depicted in FIG. 5), and in some embodiments, the memory 48 may be formed from external memory chips that are coupled to the microcontroller 44. The voltage monitoring circuit 33 may also include a power supply 52 that furnishes power via power supply lines 57 to components of the circuit 33, such as the differential amplifier 42 and the microcontroller 44. The power supply 52 may receive power (via input lines 52) that may come from power conditioning circuitry (not shown) that is associated with the fuel cell stack 32 (for example). The computer 34 may store a program 35 that may cause a microprocessor of the computer 34 to, when executing the program 35, perform the functions described above in conjunction with the routine 120 that is depicted in FIG. 6. Copies of the programs 35 and 53 may be stored on storage devices, such as CD-ROMs and floppy disk drives, as just a few examples.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A system comprising:
    a divider network adapted to be coupled to fuel cells of a fuel cell stack and provide pairs of signals, each pair of signals being associated with a different fuel cell and indicating a terminal voltage of the associated cell and another voltage common to the pair of signals;
    a memory storing indications of different common mode gains, each common mode gain indication being associated with a different one of the pairs of signals; and
    a circuit coupled to the memory and adapted to generate an indication of the terminal voltage from each pair based on the associated common mode gain indication.

2. The system of claim 1, wherein the circuit is adapted to substantially remove the indication of said another voltage common to the pair of signals from each pair of signals.

3. The system of claim 2, wherein the circuit removes the indication by multiplying the common mode gain indication associated with the pair of signals with said another voltage common to the pair of signals to produce a common mode component and subtracting the common mode component from the pair of signals.

4. The system of claim 1, wherein the fuel cell stack includes terminals associated with the different fuel cells and the divider network comprises resistor dividers, each resistor divider being adapted to receive a voltage from one of the different node voltages and provide a different one of the pairs of signals.

5. The system of claim 1, wherein the circuit comprises:
    a multiplexer adapted to select the pairs of signals one at a time; and
    a differential amplifier adapted to provide an indication of a difference between the selected pair.

6. The system of claim 5, wherein the circuit further comprises:
    a microprocessor coupled to the differential amplifier and adapted to use the indication of the difference and the associated common mode gain indication to generate the indication of the terminal voltage from each pair.

7. The system of claim 1, wherein the circuit is further adapted to estimate a common mode voltage that is associated with each pair and further base the generation of the terminal voltages from each pair on the estimation.

8. The system of claim 1, wherein the circuit comprises a microprocessor.

9. The system of claim 1, wherein the circuit comprises a microcontroller and the memory is part of the microcontroller.

10. A method comprising:
    coupling voltage measurement terminals of a fuel cell stack measurement apparatus to a common predetermined voltage to produce a first set of measured voltages;
    using the first set of measured voltages to obtain common mode voltage gains, each common mode voltage gain being associated with a different paired grouping of the terminals;
    storing indications of the common mode voltage gains in a memory;
    coupling the voltage measurement terminals to nodes associated with cells of the fuel cell stack to produce a second set of measured voltages; and
    generating indications of terminal voltages of the fuel cells based on the stored indications of the common mode voltage gains and the second set of measured voltages.

11. The method of claim 10, wherein the act of using the first set of measured voltages to obtain common mode voltage gains comprises:
    associating each measured voltage of the first set with a different one of the paired groupings;
    estimating a voltage in common with each different paired grouping; and
    for each different paired grouping, dividing the associated measured voltage of the first set with the estimated voltage in common with the paired grouping.

12. The method of claim 10, further comprising:
    communicating indications of the first set of measured voltages to a computer to calculate the common mode voltage gains.

13. The method of claim 12, further comprising:
    storing indications of the common mode voltage gains in a memory that is external the computer.

14. The method of claim 10, wherein each voltage of the second set of measured voltages includes a different one of the terminal voltages and a common mode voltage.

15. The method of claim 14, further comprising:
    for each voltage of the second set of measured voltages, substantially removing the common mode voltage.

16. The method of claim 14, further comprising:
    for each voltage of the second set of measured voltages, substantially removing the common mode voltage, wherein the act of removal comprises multiplying an indication of the associated common mode gain with an indication of the common mode voltage to produce an indication of another voltage to be subtracted from the voltage of the second set.

17. An article comprising a storage medium readable by a microprocessor-based system, the storage medium storing instructions to cause a microprocessor to:
    receive indications of a first set of measured voltages from a fuel cell voltage measurement apparatus produced by coupling measurement terminals of the measurement apparatus to a common predetermined voltage,
    use the first set of measured voltages to obtain common mode voltage gains, each common mode voltage gain being associated with a different paired grouping of the terminals, and communicate indications of the common mode voltage gains to a memory of the measurement apparatus.

18. The article of claim 17, wherein the storage medium stores instructions to cause the microprocessor to:

associate each measured voltage of the first set with a different one of the paired groupings estimate a voltage in common with each different paired grouping, and for each different paired grouping and divide the associated measured voltage of the first set with the estimated voltage in common with the paired grouping.

19. An article comprising a storage medium readable by a microprocessor-based system, the storage medium storing instructions to cause a microprocessor to:

receive indications of measured voltages produced at least in part by a divider network that is coupled to a fuel cell stack, each measured voltage being associated with a different fuel cell of the stack and including a terminal voltage of the associated cell and another common mode voltage, and generate an indication of the terminal voltage from each indicated measured voltage based on an associated common mode gain indication.

20. The article of claim 19, wherein the storage medium stores instructions to cause the microprocessor to communicate the indications of the terminal voltages to a computer.

* * * * *